(12) United States Patent
Liao et al.

(10) Patent No.: US 8,273,609 B2
(45) Date of Patent: Sep. 25, 2012

(54) METHOD FOR FABRICATING THIN FILM TRANSISTORS AND ARRAY SUBSTRATE INCLUDING THE SAME

(75) Inventors: Kuo Chu Liao, Fengshan (TW); Shan Hung Tsai, Taichung (TW); Su Fen Chen, Jhunan Township (TW); Ming Yu Chung, Jhudong Township (TW)

(73) Assignee: Chimei Innolux Corporation, Chu-Nan (TW)

( * ) Notice: Subject to any disclaimer, the term of this patent is extended or adjusted under 35 U.S.C. 154(b) by 254 days.

(21) Appl. No.: 12/622,276

(22) Filed: Nov. 19, 2009

(65) Prior Publication Data

US 2010/0129967 A1 May 27, 2010

(30) Foreign Application Priority Data

Nov. 21, 2008 (TW) ............................... 97145041 A

(51) Int. Cl.
*H01L 21/335* (2006.01)

(52) U.S. Cl. ........ 438/142; 438/149; 438/151; 438/153; 438/154

(58) Field of Classification Search .................. 438/142, 438/149, 151, 153, 154
See application file for complete search history.

(56) References Cited

U.S. PATENT DOCUMENTS

| 7,145,209 | B2 | 12/2006 | Chang et al. |
| 7,238,963 | B2 | 7/2007 | Chang et al. |
| 2007/0026347 | A1* | 2/2007 | Yao ............................... 430/346 |
| 2009/0085039 | A1 | 4/2009 | Chang et al. |

* cited by examiner

*Primary Examiner* — Jae Lee
(74) *Attorney, Agent, or Firm* — Liu & Liu

(57) ABSTRACT

The present invention relates to a method for fabricating thin film transistors (TFTs), which includes the following steps: forming a semi-conductive layer on a substrate; forming a patterned photoresist layer with a first thickness and a second thickness on the semi-conductive layer; patterning the semi-conductive layer by using the patterned photoresist layer as a mask to form a patterned semi-conductive layer; removing the second thickness of the patterned photoresist layer; performing a first ion doping process on the patterned semi-conductive layer by using the first thickness of the patterned photoresist layer as a mask; removing the first thickness of the patterned photoresist layer; and forming a dielectric layer and a gate on the patterned semi-conductive layer. The present invention also discloses a method for fabricating an array substrate including aforementioned TFTs.

10 Claims, 7 Drawing Sheets

METHOD FOR FABRICATING THIN FILM TRANSISTORS AND ARRAY SUBSTRATE INCLUDING THE SAME

BACKGROUND OF THE INVENTION

1. Field of the Invention

The present invention relates to a method for fabricating thin film transistors and, more particularly, to a method for fabricating low temperature poly-silicon (LTPS) thin film transistors.

2. Description of Related Art

Currently, numerous researchers from various fields focus on developing low temperature poly-Si thin film transistor liquid crystal displays (LTPS TFT-LCDs). In comparison to conventional a-Si TFT-LCDs, the process for fabricating LTPS TFT-LCDs is more complex and more masks are necessary. However, the area of the transistors used in LTPS TFT-LCDs have reduced due to enhanced electron mobility such that the aperture ratio of LTPS TFT-LCDs is increased and the resolution is enhanced. Nowadays, LTPS TFT-LCDs have been applied in high-leveled, medium- and small-scaled products.

FIGS. 1A to 1G show the method for fabricating conventional low temperature poly-silicon (LTPS) thin film transistors.

With reference to FIG. 1A, a poly-silicon layer is first formed on a substrate 100 by laser annealing, and the poly-silicon layer is patterned to define driver areas 102 via a first mask. The driver areas 102 were disposed in a first transistor area (NMOS) 104 and a second transistor area (PMOS) 106. Subsequently, as shown in FIG. 1B, a channel 108 is formed by performing ion doping via a second mask, and a gate insulating layer 110 is formed over the driver areas 102. Then, as shown in FIG. 1C, N+ doping regions 112 are formed by performing ion doping via a third mask. Next, a gate metal layer is formed by sputtering and gate electrodes 114 are defined via a fourth mask, as shown in FIG. 1D. After forming the gate electrodes 114, P+ doping regions 116 of the second transistor (PMOS) are formed by performing ion doping via a fifth mask, as shown in FIG. 1E. Subsequently, as shown in FIG. 1F, a silicon dioxide (SiO$_2$) film 118 is deposited, and contact holes 120 are formed in the first transistor area (NMOS) 104 and the second transistor area (PMOS) 106 via a sixth mask. Source/drain electrodes 122 are defined via a seventh mask, as shown in FIG. 1G. Finally, contact holes are formed in a passivation layer via an eighth mask, and pixel electrodes (not shown in the figures) are defined via a ninth mask. Accordingly, conventional low temperature poly-silicon (LTPS) thin film transistors are afforded.

However, the above-mentioned method for fabricating conventional low temperature poly-silicon (LTPS) thin film transistors needs many masks, and thus it has disadvantages of high cost and alignment shift between mask steps. Thereby, it is important in the art to reduce the number of used masks and improve alignment shift.

SUMMARY OF THE INVENTION

The object of the present invention is to provide a method for fabricating thin film transistors (TFTs) to reduce the number of used masks and cost and improve the problems caused by alignment shift between masks.

To achieve the object, the present invention provides a method for fabricating thin film transistors, comprising: providing a substrate and forming a semi-conductive on the substrate; forming a patterned photoresist layer with a first thickness and a second thickness on the semi-conductive layer, wherein the first thickness is larger than the second thickness; patterning the semi-conductive layer by using the patterned photoresist layer as a mask to form a patterned semi-conductive layer; removing the second thickness of the patterned photoresist layer; performing a first ion doping process on the patterned semi-conductive layer by using the first thickness of the patterned photoresist layer as a mask; removing the first thickness of the patterned photoresist layer; and forming a dielectric layer and a gate on the patterned semi-conductive layer.

Another object of the present invention is to provide a method for fabricating a TFT array substrate, comprising: providing a substrate and forming a semi-conductive on the substrate; forming a patterned photoresist layer with a first thickness and a second thickness on the semi-conductive layer, wherein the first thickness is larger than the second thickness; patterning the semi-conductive layer by using the patterned photoresist layer as a mask to form a patterned semi-conductive layer comprising a first patterned semi-conductive layer and a second patterned semi-conductive layer; removing the second thickness of the patterned photoresist layer; performing a first ion doping process on the patterned semi-conductive layer by using the first thickness of the patterned photoresist layer as a mask to form a source/drain region in the second patterned semi-conductive layer; removing the first thickness of the patterned photoresist layer; and forming a dielectric layer and a gate on the patterned semi-conductive layer.

Other objects, advantages, and novel features of the invention will become more apparent from the following detailed description when taken in conjunction with the accompanying drawings.

DETAILED DESCRIPTION OF THE PREFERRED EMBODIMENT

Hereafter, the features of the present invention will be described in detail in conjunction with embodiments.

Embodiment

With reference to FIGS. 2A to 2J, there is shown a method for fabricating thin film transistors according to the present embodiment. In the present embodiment, the photoresist layer used for two steps, which are patterning of the semi-conductive layer and first ion doping in the second transistor area can be formed by one-time exposure via a mask, and thereby any alignment shift between two masks can be avoided so as to significantly reduce the probability of defect formation.

These drawings show a process for fabricating an array substrate including thin film transistors.

Figure 1A:
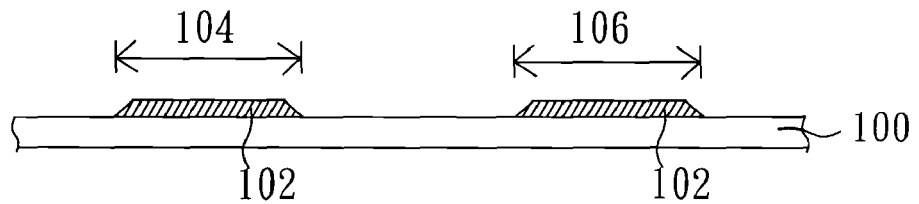
FIGS. 1A to 1G show a process for fabricating conventional low temperature poly-silicon thin film transistors.
Figure 1B:
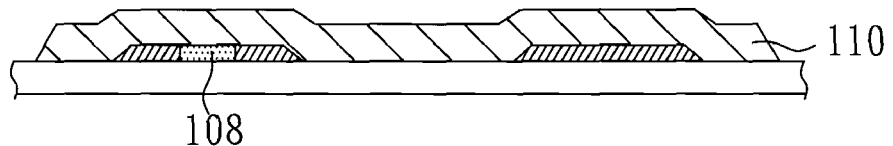
Figure 1C:
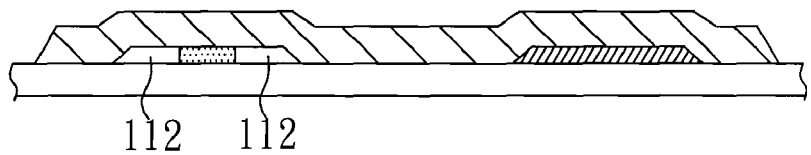
Figure 1D:
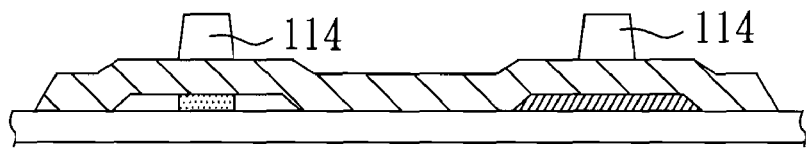
Figure 1E:
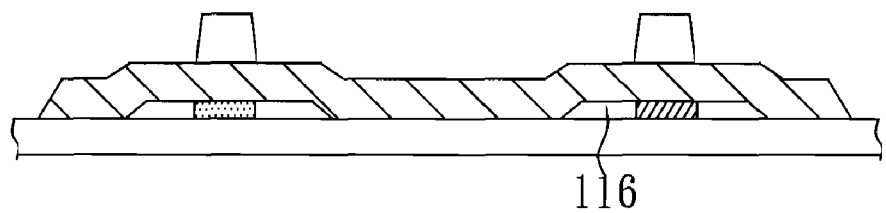
Figure 1F:
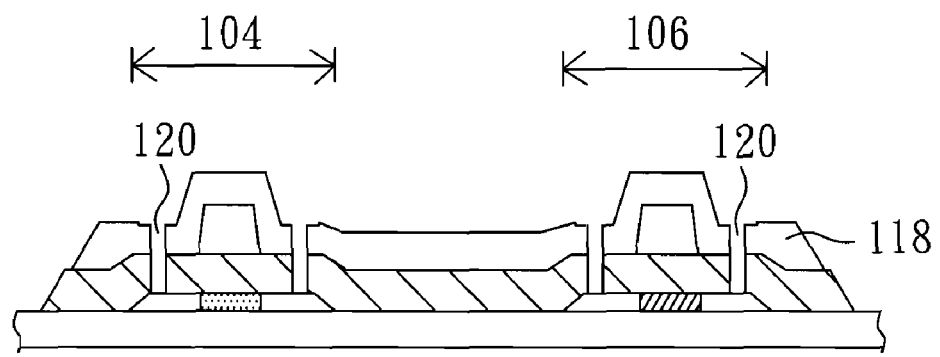
Figure 1G:
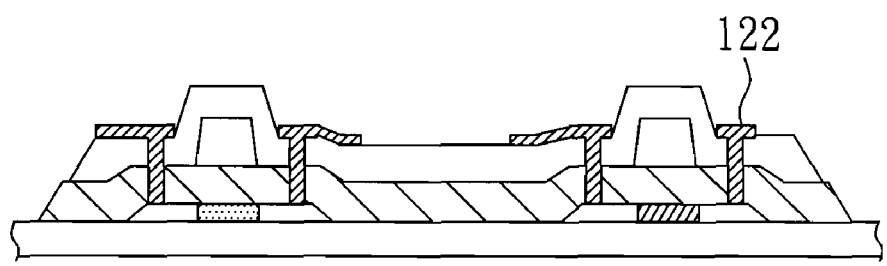
Figure 2A:
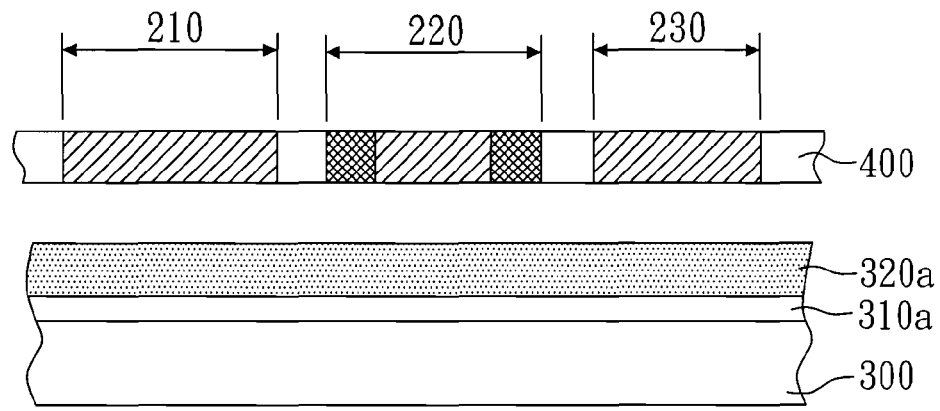
FIGS. 2A to 2J show a process for fabricating thin film transistors according to an embodiment of the present invention.

As shown in FIG. 2A, a substrate 300 is provided, in which the substrate 300 has a first transistor area 210, a second transistor area 220 and a pixel area 230. In the present embodiment, the substrate 300 is a glass substrate. According to practical requirements, a quartz substrate also can be used as the substrate 300. Hereafter, the process according to the present embodiment will be illustrated in detail.

Process for Patterning the Semi-Conductive Layer

Figure 2B:
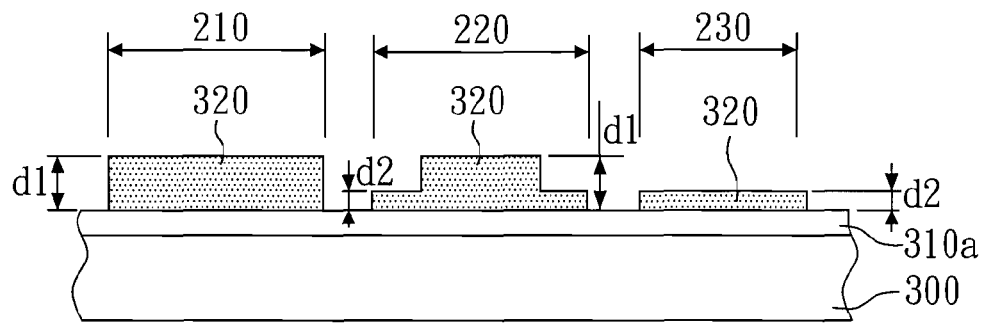
Figure 2C:
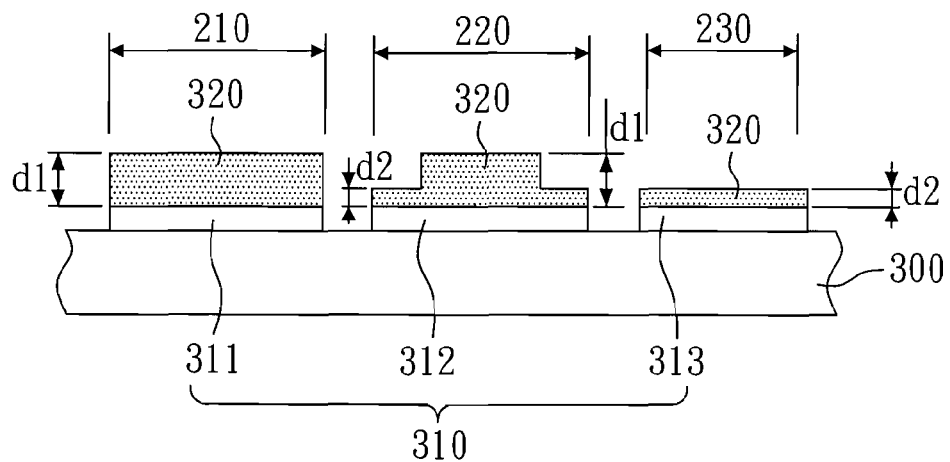

Please refer to FIGS. 2A and 2B. An amorphous silicon layer (not shown in figures) is first formed on the substrate 300, and then the amorphous silicon layer is converted into a semi-conductive layer 310a by annealing, such as laser annealing, wherein the semi-conductive layer 310a is, for example, a poly-silicon layer. Subsequently, a photoresist layer 320a is formed on the semi-conductive layer 310a and then exposed and developed via a half-tone mask 400, so that a patterned photoresist layer 320 with a first thickness d1 and a second thickness d2 is formed, as shown in FIG. 2B. Herein, the first thickness d1 is larger than the second thickness d2. Then, by the patterned photoresist layer 320 used as a mask, the semi-conductive layer 310a is patterned to form a patterned semi-conductive layer 310, wherein the patterned semi-conductive layer 310 includes a first patterned semi-conductive layer 311 and a second patterned semi-conductive layer 312. That is, partial areas of the semi-conductive layer 310a are exposed by the patterned photoresist layer 320 formed on the semi-conductive layer 310a. Thereby, the exposed parts of the semi-conductive layer 310a can be removed to form the patterned semi-conductive layer 310, as shown in FIG. 2C. In the present embodiment, preferably, the patterned photoresisted layer 320 is also formed in the pixel area 230 to be used as a mask so as to form a third patterned semi-conductive layer 313, as shown in FIG. 2C.

First Ion Doping Process (P-Typed Ion Doping)

Figure 2D:
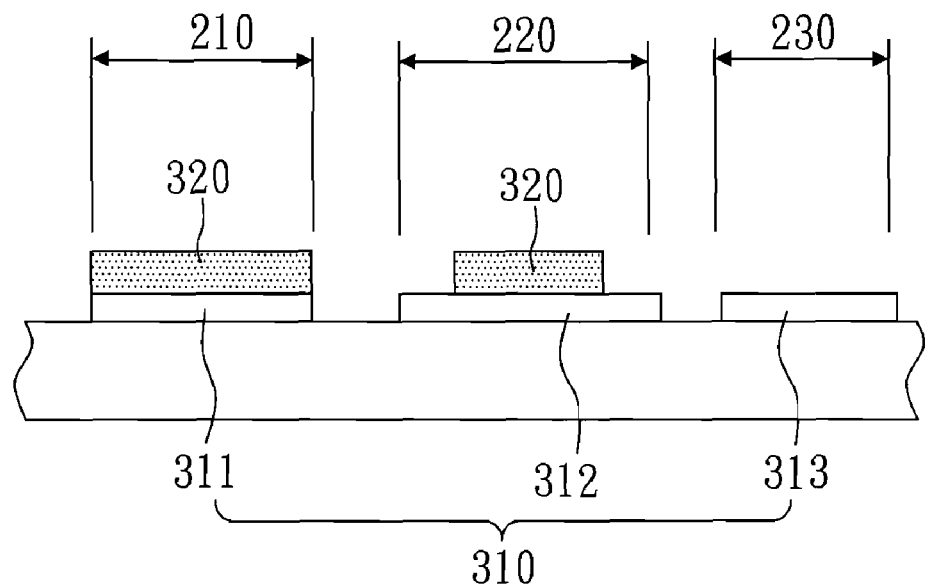

Please refer to FIGS. 2C and 2D. As shown in FIG. 2C, the patterned photoresist layer 320 of the present embodiment has a first thickness d1 and a second thickness d2. Herein, the patterned photoresist layer 320 corresponding to the first patterned semi-conductive layer 311 has a first thickness d1; the patterned photoresist layer 320 corresponding to the second patterned semi-conductive layer 312 has a first thickness d1 and a second thickness d2; and the patterned photoresist layer 320 corresponding to the third patterned semi-conductive layer 313 has a second thickness d2. Then, with reference to FIG. 2D, by means of ash, the thickness of the patterned photoresist layer 320 is entirely reduced to remove the second thickness d2 of the patterned photoresist layer 320 such that the third patterned semi-conductive layer 313 and parts of the second patterned semi-conductive layer 312 are exposed. In the present embodiment, in addition to ash, any conventional thinning process used in general related industry can be applied to reduce the thickness of the patterned photoresist layer 320.

Figure 2E:
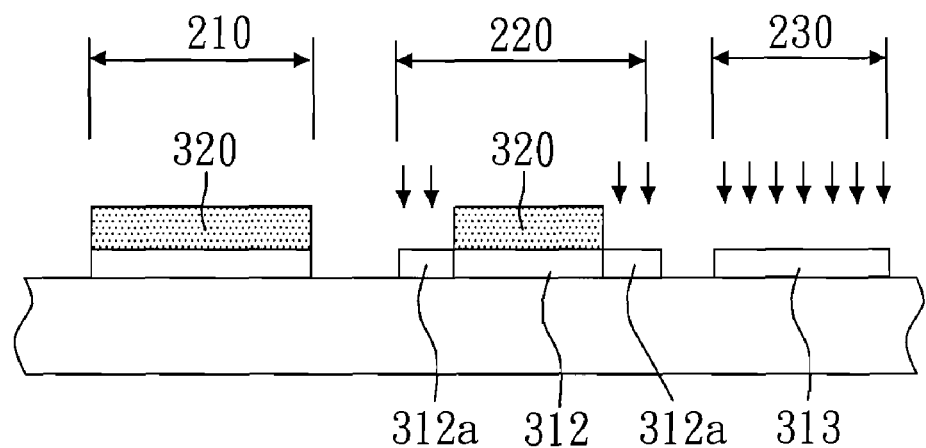

Subsequently, with reference to FIG. 2E, the remaining part of the patterned photoresist layer 320 is used as a mask to perform a first ion doping process. Herein, the first ions are P-typed ions. Accordingly, first source/drain regions 312a are formed in the second patterned semi-conductive layer 312.

Meanwhile, the third patterned semi-conductive layer 313 in the pixel area 230 is processed as an electrode of a semi-conductor capacitor by the first ion doping process.

Channel Doping

Figure 2F:
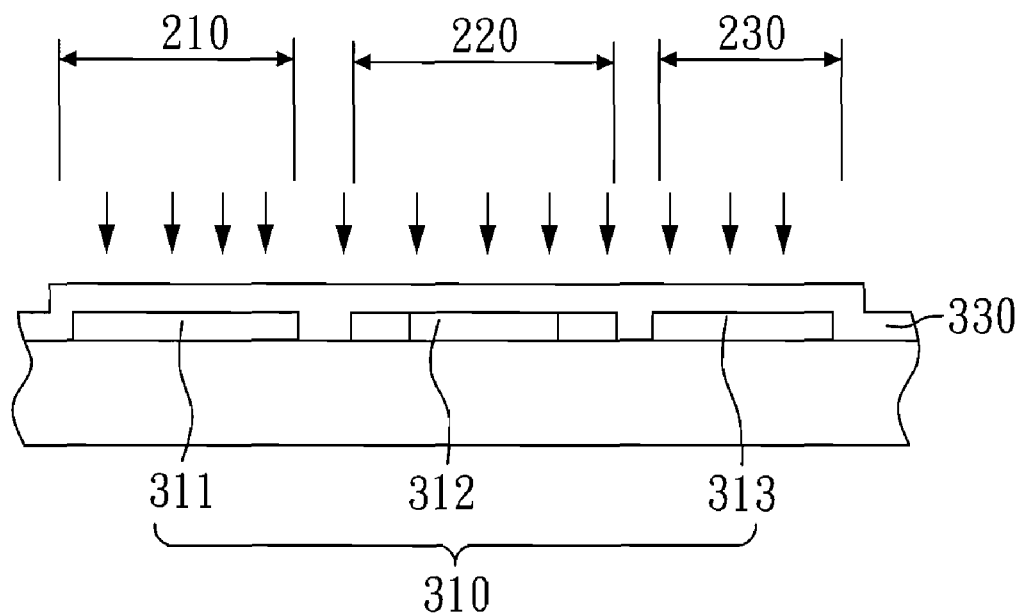

With reference to FIG. 2F, the patterned photoresist layer 320 is removed, and a channel doping process can be selectively performed on the patterned semi-conductive layer 310. Accordingly, in a subsequent process, a channel region can be formed in the first transistor area 210. Herein, the ion doping concentration (P-typed ion doping concentration) in the channel doping process is less than the first ion doping concentration in the first ion doping process. The channel doping process can be selectively performed according to practical conditions. Next, a layer of $SiN_x$, $SiO_x$ or the combination thereof is formed over the first patterned semi-conductive layer 311, the second patterned semi-conductive layer 312 and the third patterned semi-conductive layer 313 to function as a dielectric layer 330, as shown in FIG. 2F.

Formation of Gate

Figure 2G:
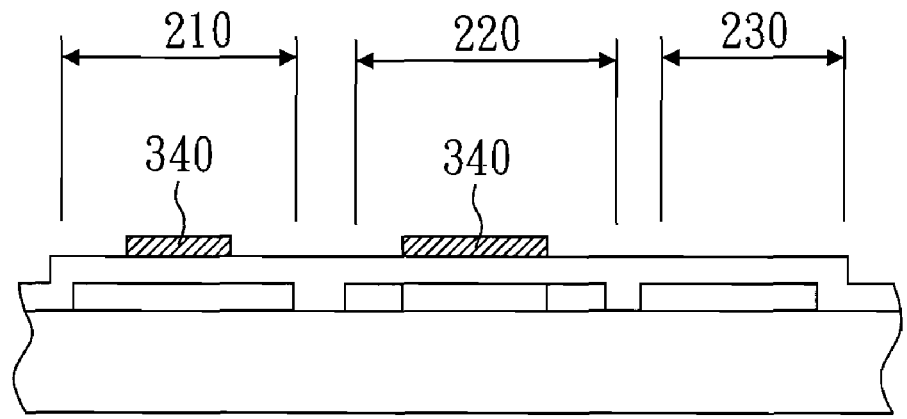

With reference to FIG. 2G, gates 340 are formed in the first transistor area 210, the second transistor area 220 and the partial pixel area 230 to function as gates of the first transistor area 210 and the second transistor area 220, respectively. Herein, the gate 340 of the pixel area 230 is not shown in FIG. 2G. In the present embodiment, the material of the gate 340 is not specifically limited. Preferably, the material of the gate 340 is selected from the group consisting of Al, W, Cr, Mo and a combination thereof.

Second Ion Doping Process (N-Typed Ion Doping)

Figure 2H:
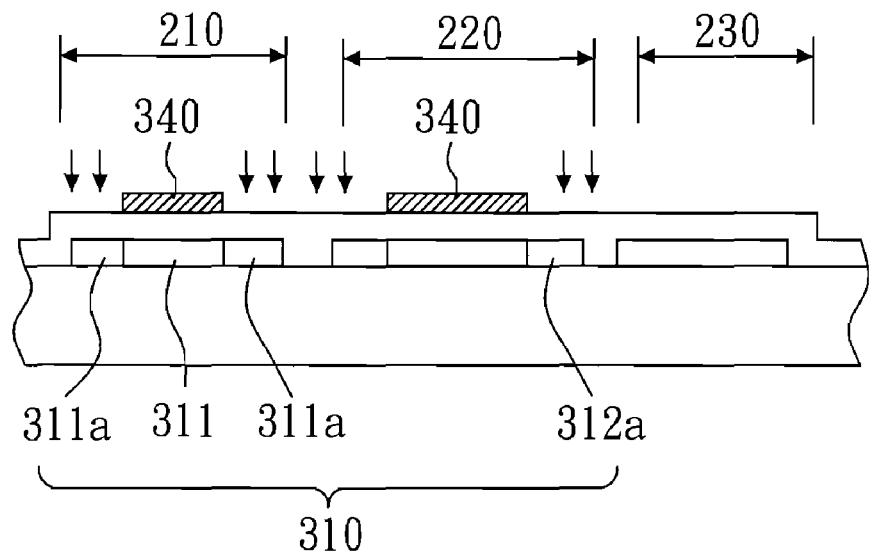

As shown in FIG. 2H, the gates 340 are used as masks to perform a second ion doping process on the patterned semi-conductive layer 310. Accordingly, second source/drain regions 311a are formed in the first patterned semi-conductive layer 311. It is noted that, since the first source/drain regions 312a are exposed, the second ion doping concentration in the second ion doping process (i.e. N-typed ion doping) has to be controlled to be less than the first ion doping concentration in the first ion doping process (i.e. P-typed ion doping), so as to avoid the second ion doping process influencing the conductivity of the first source/drain regions 312a. In addition, in the case that a channel doping process is performed before the second ion doping process, the second ion doping concentration in the second ion doping process (i.e. N-typed ion doping) has to be larger than the doping concentration in the channel doping process (i.e. ion doping in the first transistor area) to form the second source/drain regions 311a.

Formation of Contact Holes

Figure 2I:
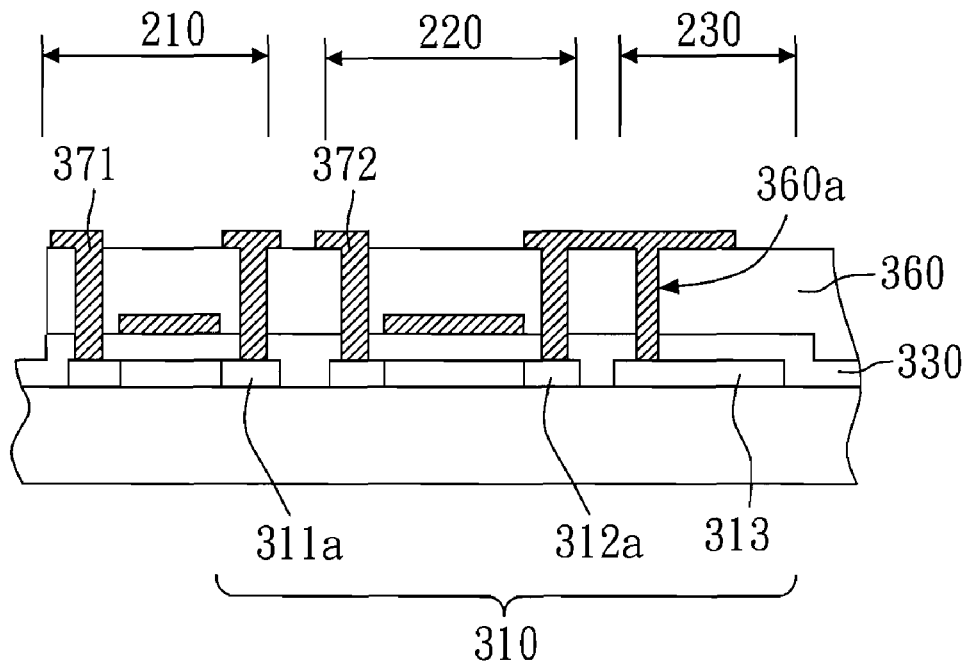

With reference to FIG. 2I, a passivation layer 360 is formed over the substrate 300. Subsequently, contact holes 360a are formed in the passivation layer 360 and the dielectric layer 330 to expose the partial second source/drain region 311a, the partial first source/drain region 312a and the partial third patterned semi-conductive layer 313.

Formation of Source/Drain Electrode

Next, as shown in FIG. 2I, metal is deposited on the passivation layer 360 and in the contact holes 360a to define the second source/drain electrode 371 and the first source/drain electrode 372. In the present embodiment, the second source/drain electrode 371 and the first source/drain electrode 372 are filled in the contact holes 360a and cover the partial surface of the passivation layer 360.

Formation of Via Opening and ITO

Figure 2J:
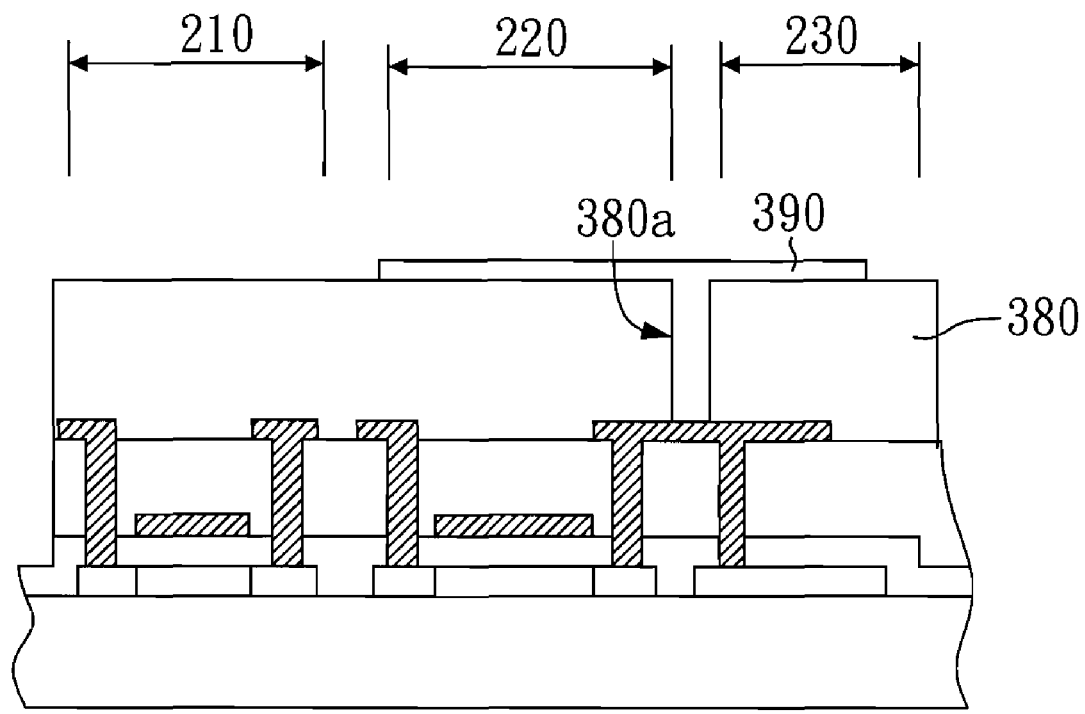

As shown in FIG. 2J, a planarization layer 380 is formed on the passivation layer 360, and then the opening 380a is formed in the planarization layer 380.

Subsequently, a patterned transparent electrode layer 390 is formed so as to form a TFT array substrate for a liquid crystal display.

In view of the present embodiment, it can be found that a patterned photoresist layer with different thickness can be formed by a half-tone mask, and thereby the steps for patterning the semi-conductive layer and first ion doping in the second transistor can be accomplished via the same patterned photoresist layer, such that an additional mask is unnecessary. Accordingly, the number of masks used in the process can be reduced. Thereby, the steps for lithography and etching can be simplified to reduce difficulty in manufacture and cost and thus enhance throughput. In addition, since the two steps for patterning the semi-conductive layer and first ion doping in the second transistor are performed by a single mask and one-time exposure, the issue of alignment shift between two masks can be avoided so as to significantly reduce the probability of defect formation and achieve the purpose of reducing manufacture cost and enhancing the yield of products.

Although the present invention has been explained in relation to its preferred embodiment, it is to be understood that many other possible modifications and variations can be made without departing from the scope of the invention as hereinafter claimed.

What is claimed is:

1. A method for fabricating a thin film transistor array substrate, comprising:
    providing a substrate and forming a semi-conductive on the substrate, wherein the substrate has a pixel area;
    forming a patterned photoresist layer with a first thickness and a second thickness on the semi-conductive layer, including forming the patterned photoresist layer on the semi-conductive layer in the pixel area of the substrate, wherein the first thickness is larger than the second thickness, and wherein the patterned photoresist layer in the pixel area has the second thickness;
    patterning the semi-conductive layer by using the patterned photoresist layer as a mask to form a patterned semi-conductive layer comprising a first patterned semi-conductive layer and a second patterned semi-conductive layer;
    removing the second thickness of the patterned photoresist layer;
    performing a first ion doping process on the patterned semi-conductive layer by using remaining part of the patterned photoresist layer as a mask to form a source/drain region in the second patterned semi-conductive layer;
    removing the first thickness of the patterned photoresist layer on the second patterned semi-conductive layer; and
    forming a dielectric layer and a gate on the patterned semi-conductive layer.

2. The method as claimed in claim 1, wherein part of the second patterned semi-conductive layer is exposed after the second thickness of the patterned photoresist layer is removed.

3. The method as claimed in claim 1, further comprising; performing a second ion doping process on the patterned semi-conductive layer by using the gate as a mask to form a source-drain region in the first patterned semi-conductive layer.

4. The method as claimed in claim 3, wherein doping concentration of the second ions in the second ion doping process is less than doping concentration of first ions in the first ion doping process.

5. The method as claimed in claim 3, further comprising a step between the first ion doping process and the second ion doping process, which comprises performing a channel doping process on the patterned semi-conductive layer to form a channel region in the second patterned semi-conductive layer.

6. The method as claimed in claim 5, wherein doping concentration of ions in the channel doping process is less than doping concentration of first ions in the first ion doping process.

7. The method as claimed in claim 1, wherein the step of forming the patterned semi-conductive layer comprises forming a third patterned semi-conductive layer by using the patterned photoresist layer as a mask.

8. The method as claimed in claim 7, wherein the first ion doping process is further performed on the third patterned semi-conductive layer to use the doped third patterned semi-conductive layer as an electrode of a semiconductor capacitor in the pixel area.

9. The method as claimed in claim 1, wherein the process for forming the patterned photoresist layer on the substrate comprises:
    forming a photoresist layer on the substrate; and
    patterning the photoresist layer by a half-tone mask to form the patterned photoresist layer with the first thickness and the second thickness.

10. The method as claimed in claim 1, wherein the patterned photoresist layer corresponding to the first patterned semi-conductive layer has the first thickness and the patterned photoresist layer corresponding to the second patterned semi-conductive layer has the first thickness and the second thickness.

* * * * *